United States Patent [19]

Vander Putten

[11] 4,076,535

[45] Feb. 28, 1978

[54] METHOD OF PREPARING SCREENS FOR SCREEN PRINTING

[75] Inventor: Paul R. Vander Putten, Brussels, Belgium

[73] Assignee: Carnation Company, Los Angeles, Calif.

[21] Appl. No.: 602,861

[22] Filed: Aug. 7, 1975

Related U.S. Application Data

[63] Continuation of Ser. No. 421,369, Dec. 3, 1973, abandoned.

[51] Int. Cl.$^2$ .............................................. G03C 1/76
[52] U.S. Cl. ....................................... 96/67; 96/36.4; 96/116; 101/128.3
[58] Field of Search ................ 96/36.4, 45, 116, 67, 96/48; 101/128.3

[56] References Cited

U.S. PATENT DOCUMENTS

| 3,100,150 | 8/1963 | Chismar et al. | 96/45 |
| 3,246,986 | 4/1966 | Borchers | 96/36.4 |
| 3,510,303 | 5/1970 | Preddy et al. | 96/36.4 |
| 3,532,052 | 10/1970 | Erickson | 101/128.3 |
| 3,538,847 | 11/1970 | Heilman | 101/128.3 |
| 3,597,217 | 8/1971 | Schumacher | 96/116 |
| 3,661,575 | 5/1972 | Ketley et al. | 96/45 |

*Primary Examiner*—Edward C. Kimlin
*Attorney, Agent, or Firm*—Eugene C. Ziehm; Robert D. Kummel

[57] ABSTRACT

Screens for use in screen process printing are prepared by applying a dry emulsion film to a layer of liquid emulsion carried on the outer surface of a screen fabric in such a manner that upon drying, the dry emulsion film and the liquid emulsion layer are coalesced into a unitary emulsion layer which surrounds the screen fabric. The coalesced emulsion layer has a smooth surface which extends a uniform distance above the screen fabric. Screens thus produced are used to prepare photographic stencils for use in screen process printing.

6 Claims, 9 Drawing Figures

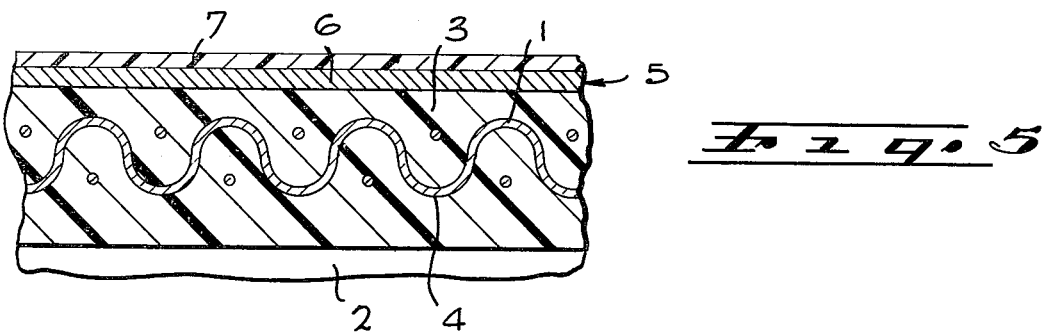
Fig. 5
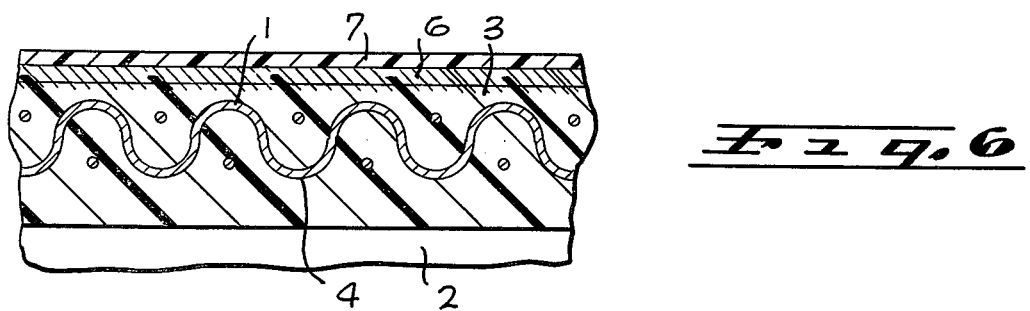
Fig. 6
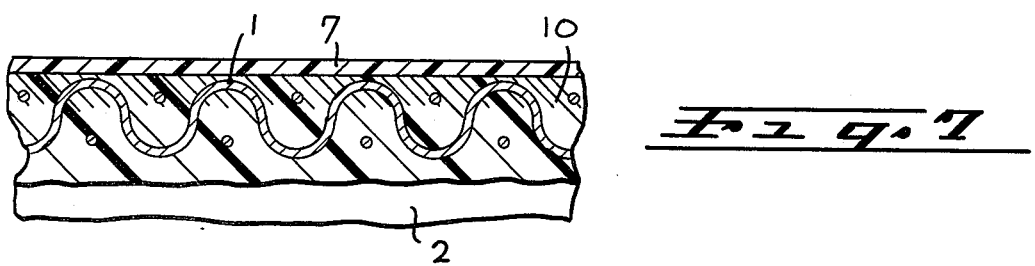
Fig. 7
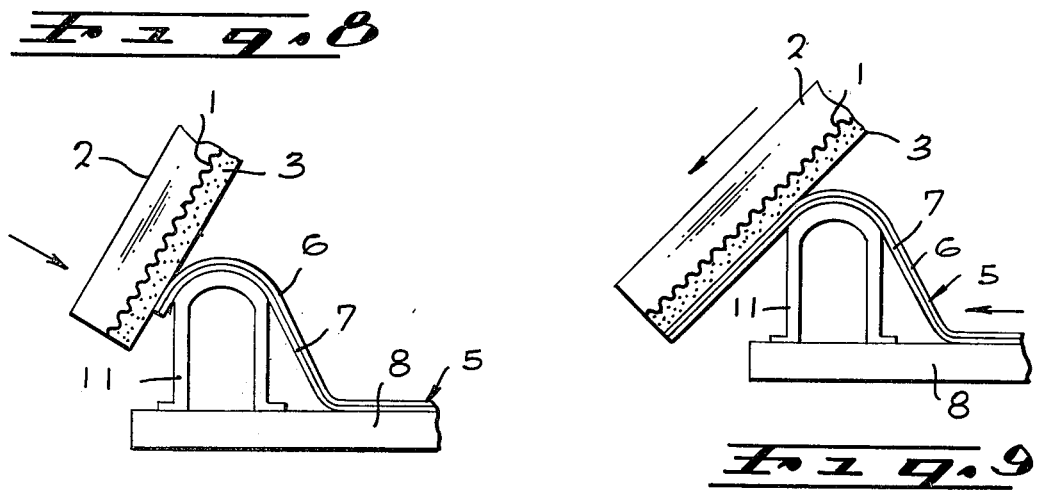
Fig. 8
Fig. 9

METHOD OF PREPARING SCREENS FOR SCREEN PRINTING

This is a continuation, of application Ser. No. 421,369 filed Dec. 3, 1973, now abandoned.

BACKGROUND OF THE INVENTION

This invention relates to a method of preparing screens suitable for use in screen process printing and to the preparation of photographic stencils from the screens so prepared.

Most photographic stencils used in screen process printing are prepared by either of two general methods, the transfer method and the direct method. In both methods, the photographic process of forming the stencil is essentially the same and involves placing a photograhic positive or negative, which has the image or design on it to be reproduced, against a photosensitive emulsion layer and exposing the whole unit to a source of light, whereby the emulsion is hardened in those areas struck by light. Those portions of the emulsion not struck by light remain soluble and are removed, for example, by water spray, to thereby provide the desired image or design in the emulsion. The two methods differ, however, in the technique by which the emulsion layer is provided on the screen fabric for use in printing.

In the transfer method, a photosensitive emulsion layer is carried on a support or backing sheet during the photographic exposure and washout when the image or design is formed in the emulsion. The emulsion layer, while in a moist and softened condition, is then placed in pressure contact with the screen fabric and dried, whereby the emulsion layer adheres to the fabric. Upon removal of the backing sheet, the stencil is ready for use.

In the direct method, the photosensitive emulsion is coated directly on the screen to fill the mesh of the screen and provide a layer of emulsion over the surface of the screen. After drying, the screen is processed photographically in the manner described above to provide a stencil having the desired image or design.

While the transfer method and the direct method are widely used, both methods have inherent disadvantages which adversely affect their use in commercial operations. For example, since screens prepared by the direct method are manually coated with emulsion, one at a time, it is difficult to maintain a uniform and reproducible thickness of the emulsion coating. Consequently stencils made using such emulsion coated screens have a surface which is irregular in thickness. Moreover, since the emulsion coated on the screen dries with no external support, the emulsion shrinks in all directions upon drying. Thus, in addition to shrinking into the screen the horizontal dimension of the emulsion layer shrinks in such a way that the edge surface tension effects cause a pulling of the emulsion back to the screen filaments. As a result, the edge of a stencil prepared by the direct method frequently is serrated or saw-toothed rather than a straight line. While stencils prepared by the transfer method are not subject to these disadvantages, such transfer method stencils lack the durability of stencils prepared by the direct method, since the emulsion layer is attached essentially only to the surface of the screen, with the screen fabric being embedded in the emulsion layer to a depth of only about 0.0003 – 0.0005 inch (0.3 – 0.5 mils).

In recent years another technique, a direct-film method has been suggested for use in preparing photographic stencils. According to this technique, a dry screen is placed on top of and in perfect contact with an unsensitized dry emulsion layer carried on a backing sheet. A limiting amount of photosensitive liquid emulsion is then squeegeed through the screen so that the liquid emulsion contacts the dry emulsion layer and secures it to the surface of the screen in its original thickness. After drying, the backing sheet is removed and the stencil is prepared by conventional photographic techniques. However, since the intent of this procedure is to prevent embedding of the screen in the dry emulsion layer, the resulting stencils lack the durability of stencils prepared by the direct method. Also, since the screen must be in perfect contact with the entire surface of the dry emulsion layer, this method is difficult and inconvenient to use, particularly when large stencils must be prepared.

SUMMARY OF THE INVENTION

The present invention provides a relatively simple method of preparing screens for use in screen process printing. Photographic stencils made with screens of the present invention have good durability and a high degree of uniformity. According to the present invention a photosensitive liquid emulsion is applied to a prestretched screen so that the liquid emulsion fills the mesh of the screen and provides a relatively thick layer of liquid emulsion on the outer surface of the screen, that is, the surface of the screen which is to carry the stencil. The layer of liquid emulsion is placed in line contact with an end portion of dry emulsion film carried on a flexible backing sheet, the said end portion of the dry film being slidably mounted on a firm, smooth supporting surface. The screen, carrying the layer of liquid emulsion is then drawn downwardly while maintaining the liquid emulsion in line contact with the dry film until the entire surface of the dry emulsion film is in contact with and wetted by the liquid emulsion. The dry emulsion film thereby becomes softened by the liquid emulsion layer with the result that the two emulsions are diffused into one another at the interface. Consequently the two emulsions, upon drying, are coalesced into a unitary emulsion layer which fills the mesh and extends a slight distance above the outer surface of the screen fabric. The photosensitizer which was originally in the liquid emulsion layer is distributed substantially uniformly throughout this unitary emulsion layer. Moreover, since the flexible backing sheet is retained during the drying operation, lateral shrinkage of the outer surface of the emulsion during drying is inhibited so that only a controlled amount of shrinkage of the emulsion into the screen fabric takes place. When drying is completed, the flexible backing sheet is removed to provide a screen having a smooth surface of uniform thickness with the screen fabric being embedded in the emulsion. Photographic stencils may be made from the screens thus prepared by conventional photographic procedures. Stencils made according to the present invention have good durability and provide the advantages of a smooth surface of uniform thickness and sharp detail in printing.

BRIEF DESCRIPTION OF THE DRAWINGS

FIGS. 5 – 7 are cross-sectioned views of a portion of the screen after the application of the dry emulsion film to the liquid emulsion layer, showing different stages in the drying of the screen.

FIGS. 8 – 9 are end views illustrating another embodiment of the method of applying a dry emulsion film to the liquid emulsion layer.

It will be understood that the figures are not drawn to scale but are intended only to illustrate the present invention.

DESCRIPTION OF PREFERRED EMBODIMENTS

Figure 1:
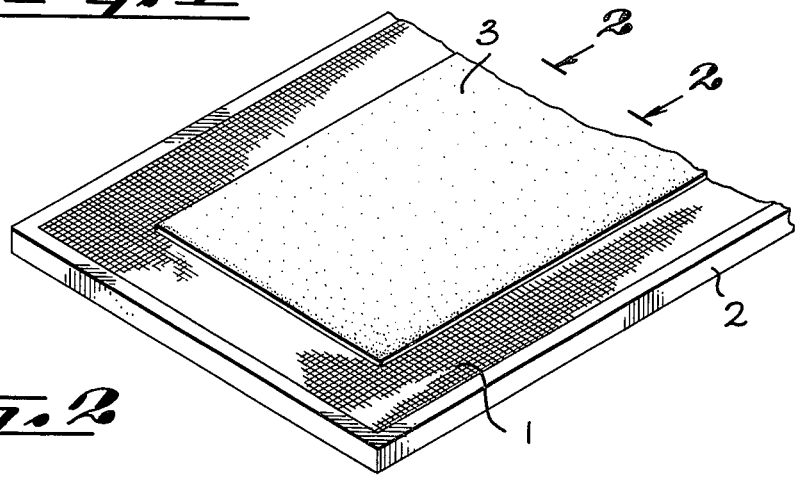
FIG. 1 is a perspective view of a screen carrying a layer of liquid emulsion on its outer surface.
Figure 2:
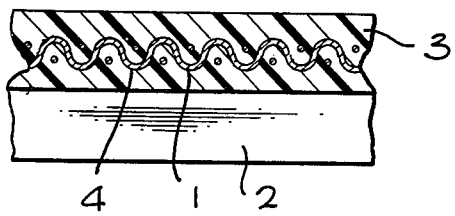
FIG. 2 is a cross-sectional view of a portion of the screen taken along lines 2 — 2 in FIG. 1.

In preparing screens for use in screen process printing according to the method of this invention, a conventional prestretched screen fabric 1, made of any suitable material such as silk, nylon, rayon, dacron, stainless steel, and the like, secured to a rigid frame 2, is coated with photosensitive liquid emulsion to provide a layer 3 of emulsion on the outer surface of the screen fabric, that is, the surface which is to carry the stencil. The photosensitized liquid emulsion may be applied to the screen fabric by any suitable technique capable of filling the screen mesh with emulsion and providing a relatively thick layer of emulsion over at least the outer surface of the fabric. Thus, according to one embodiment, a quantity of liquid emulsion poured onto a hand coater is used to coat the outer surface of the stretched screen fabric, filling the mesh and forcing emulsion through the screen fabric. The screen frame is then reversed and additional emulsion applied from the inside, forcing excess emulsion to the outer surface of the screen and providing a relatively thick layer of emulsion over the outer surface of the screen fabric. Other suitable coating techniques may of course be used such as, for example, spray-coating, coating by means of rollers, troughs or squeegee, and the like. Generally, the emulsion layer 3 extends about 1 to 20 mils above the screen fabric, and preferably from 2 to 15 mils above the fabric. While the emulsion layer 3 may be provided over the entire outer surface of the screen fabric, it may, if desired, extend only over that portion which is intended to be used in providing the stencil to be formed in the completed screen. As shown in FIG. 2, which is a cross-sectional view of a portion of the screen at the completion of this step, the emulsion may also extend over the inner surface 4 of the screen fabric.

Any of the conventional liquid emulsions commonly used in the preparation of photographic printing screens, such as for example polyvinyl alcohol, polyvinyl acetate, mixtures of polyvinyl alcohol and polyvinyl acetate, gelatin, and the like, may be used in the present invention to provide the emulsion layer 3. The liquid emulsion as it is applied to the screen fabric has contained therein an effective amount of a conventional photosensitizer, such as, for example, potassium dichromate, ammonium dichromate or other water soluble dichromates, diazo compounds, azido compounds ferriammonium salts of water soluble polybasic organic acids, and the like. The viscosity of the liquid emulsion is such that the uniform thickness of layer 3 is maintained above the outer surface of the screen fabric even when the frame is held in a vertical position.

Figure 3:
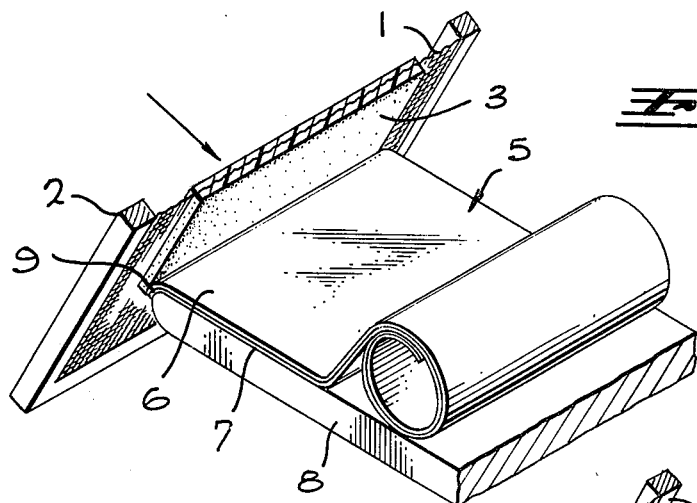
FIGS. 3 and 4 are perspective views showing the method of the present invention in applying a dry emulsion film to the liquid emulsion layer.
Figure 4:
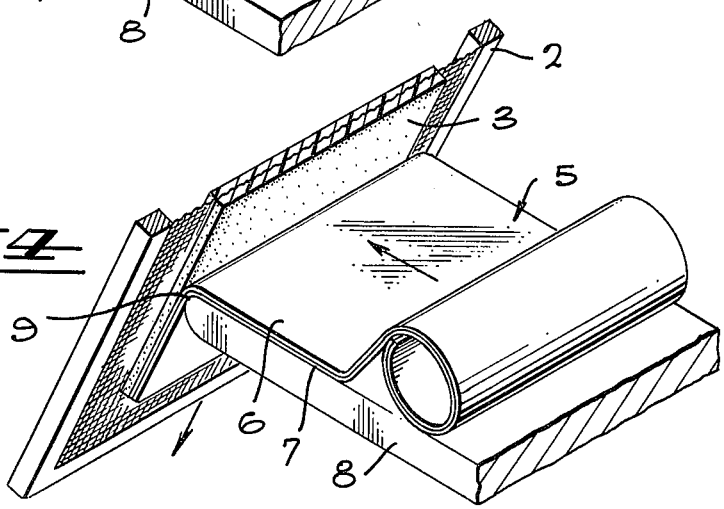

As shown in FIG. 3, the emulsion layer 3 while still in a liquid state, is placed in line contact, across the width of the layer, with an end portion of a transfer film 5, comprising a dry emulsion film 6 carried on a flexible backing sheet 7, with the liquid emulsion layer being placed in contact with the dry emulsion film 6. The transfer film 5 is supported on a smooth, rigid base 8 and is slidably disposed thereon. The portion of the transfer film 5 which is to be in line contact with the liquid emulsion layer 3 is positioned at the edge 9 of the rigid base, as shown in FIG. 3, to permit the frame carrying the liquid emulsion layer to be drawn below the plane of the base. The frame, carrying the liquid emulsion layer, is then drawn downwardly, as shown in FIG. 4, while maintaining the liquid emulsion in line contact with the dry emulsion film at the edge of the base until the entire surface of the dry emulsion film is in contact with and wetted by the liquid emulsion layer. Thus, when the frame is drawn downwardly while exerting continuous, substantially uniform pressure against the edge of the supporting base, the transfer film is drawn onto the emulsion layer as the emulsion layer moves past the base edge, with the surface tension of the liquid layer pulling the transfer film into contact therewith. FIG. 5 illustrates an enlarged cross-sectional view of a portion of the screen at the completion of this step, with the dry emulsion film 6 being in uniform contact with liquid emulsion layer 3 a substantially uniform distance above the screen fabric. Any excess or puddled liquid emulsion over the inner surface of the screen may be removed such as by a single pass of a clean coater.

The liquid emulsion is then dried by any conventional drying technique, such as for example, by directing a flow of warm air against the emulsion. The flexible backing sheet 7 is retained on the emulsion film 6 during the drying operation, in order to inhibit lateral shrinkage of the emulsion during drying.

Upon contact with the liquid emulsion, the dry emulsion film is wetted, causing it to become softened and to swell or expand into the liquid emulsion shortly after contact therewith. As a result, the two emulsion layers 3 and 6 begin to diffuse into one another at the interface of the layers, as illustrated in FIG. 6. This diffusion continues through the drying operation, during which time solvent is being removed from the liquid emulsion causing the liquid emulsion layer to shrink in a vertical dimension into the screen. At the completion of the drying step, as shown in FIG. 7, the two emulsions are coalesced into a unitary emulsion layer 10 which extends a uniform distance slightly above the outer surface of the screen fabric, generally between about 0.1 to 1.8 mils above the outer surface of the fabric, depending upon the thickness of the dry emulsion film used and the mesh and material of the screen fabric. The coalesced emulsion layer 10 completely surrounds the screen fabric 1, with the outer surface of the screen fabric being embedded within the original dry emulsion film 6.

After drying, the backing sheet 7 may be easily removed from the emulsion layer to provide a screen for use in screen process printing, the screen having a smooth surface of uniform thickness. After removal of the backing sheet the screen may be used to prepare a photographic stencil in a conventional manner. For example, a positive, having on it the design or image to be reproduced, is placed against the outer surface of the dried coalesced emulsion 10. This combination is then exposed, through the positive, to a suitable light source for a period of time sufficient to insolubilize the portions of the emulsion struck by light. The areas of the emulsion not so insolubilized are then washed out, such as by the use of a waterspray, and the stencil thus prepared is then dried.

The dry emulsion film 6, which ultimately forms the outer surface of stencils prepared according to this invention, may be formed of any of the conventional emulsions discussed above commonly used in screen process printing and may or may not be the same as the emulsion used in the liquid emulsion layer 3. The backing sheet 7 may be made of paper, a thin, flexible plastic such as polyethylene, polystyrene, or vinylcopolymers, or any suitable material and has a release coating or self release characteristics on the side carrying the dry emulsion film to permit easy removal of the backing. Although the dry emulsion film 6 can be photosensitive, preferably it is not photosensitive, thereby facilitating storage and handling of the transfer film. However, when emulsion film 6 is applied to the liquid emulsion layer 3 and the two emulsions diffuse into one another, emulsion film 6 is rendered photosensitive.

Transfer film 5 is generally prepared by coating a uniform layer of a suitable emulsion on a flexible backing sheet and drying the emulsion. Suitable transfer films are available commercially under a number of trademarks, such as D-Cote film which is a polyvinyl acetate-polyvinyl alcohol emulsion coated on a plastic support. The thickness of the dry emulsion film may be from about 0.5 to 2.5 mils, preferably 1 to 2 mils. When a transfer film having a dry emulsion layer of about 1.5 mil in thickness is used in the present invention, it has been found that the coalesced emulsion layer 10 extends about 0.1 to 0.5 mils above the outer surface of the screen fabric, depending on the mesh and material of the fabric, with the remainder of the emulsion extending into the fabric.

FIGS. 8 and 9 illustrate another embodiment of the invention in which the end portion of the transfer film 5 which is to be in line contact with the liquid emulsion layer 3 is elevated above the base 8 such as by being disposed over channel member 11. Elevating the end portion of the transfer film in such a manner facilitates the line contact of the dry emulsion film with the liquid emulsion layer and the application of the dry film over the surface of the liquid emulsion. Other suitable means for elevating the end portion of the transfer film, such as a cylinder, tube, and the like, may be used, but should have a smooth surface to permit the transfer film to slide thereover.

The method of the present invention is not only capable of providing durable, uniform screens for use in screen process printing, but also enables large screens to be prepared in a minimum amount of space and in a minimum amount of time.

I claim:

1. A method of preparing screens for use in screen process printing which comprises applying a photosensitive liquid emulsion to a prestretched screen fabric so that the emulsion fills the mesh of the screen fabric and forms a layer of substantially uniform thickness on the outer surface of the screen fabric, placing the liquid emulsion layer in line contact across the width of the layer with the end portion of a film of dry emulsion carried on a flexible backing sheet, maintaining said line contact while drawing the liquid emulsion layer downwardly against the dry emulsion film until the entire surface of the dry emulsion film is in contact with and wetted by the liquid emulsion, and drying the emulsion whereby the emulsion layer and emulsion film are coalesced into a unitary photosensitive emulsion layer having the screen fabric embedded therein.

2. The method defined in claim 1 in which the layer of liquid emulsion extends about 1 to 20 mils above the outer surface of the screen fabric.

3. The method defined in claim 1 in which the dry emulsion film is supported on a smooth base and the portion of the emulsion film to be in line contact with the liquid emulsion is positioned at the edge of the base whereby the liquid emulsion layer may be drawn below the plane of the base.

4. The method defined in claim 3 in which the portion of the dry emulsion film which is to be in line contact with the liquid emulsion layer is elevated above the base.

5. The method defined in claim 1 in which the coalesced emulsion layer extends about 0.1 to 1.8 mils above the outer surface of the screen fabric, with the remainder of the emulsion extending into the screen fabric.

6. The method defined in claim 1 in which the flexible backing sheet is removed from the coalesced emulsion layer after drying and a photographic stencil is formed in the coalesced emulsion.

* * * * *